US008865562B2

(12) United States Patent
Lee (10) Patent No.: US 8,865,562 B2
(45) Date of Patent: Oct. 21, 2014

(54) METHOD OF MANUFACTURING SEMICONDUCTOR DEVICE

(75) Inventor: Duk Eui Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 222 days.

(21) Appl. No.: 13/601,676

(22) Filed: Aug. 31, 2012

(65) Prior Publication Data

US 2013/0164926 A1 Jun. 27, 2013

(30) Foreign Application Priority Data

Dec. 22, 2011 (KR) .................. 10-2011-0140200

(51) Int. Cl.
*H01L 21/764* (2006.01)
*H01L 27/115* (2006.01)

(52) U.S. Cl.
CPC ........ *H01L 27/11524* (2013.01); *H01L 21/764* (2013.01)
USPC ........... 438/422; 735/585; 735/593; 735/595; 735/696; 735/705; 735/734

(58) Field of Classification Search
CPC .................... H01L 21/764; H01L 27/11524
USPC .......... 438/422, 585, 593, 595, 696, 705, 734
See application file for complete search history.

(56) References Cited

U.S. PATENT DOCUMENTS

| 8,691,703 | B2 * | 4/2014 | Kim et al. ........... | 438/734 |
|---|---|---|---|---|
| 2007/0096202 | A1 * | 5/2007 | Kang et al. ........... | 257/324 |
| 2007/0184615 | A1 * | 8/2007 | Brazzelli et al. ....... | 438/266 |
| 2008/0003724 | A1 * | 1/2008 | Cho et al. ............ | 438/142 |
| 2009/0087977 | A1 * | 4/2009 | Spuller et al. ......... | 438/593 |
| 2009/0218614 | A1 * | 9/2009 | Aoyama et al. ........ | 438/257 |
| 2010/0295113 | A1 * | 11/2010 | Kang et al. ........... | 257/316 |
| 2012/0070976 | A1 * | 3/2012 | Kim et al. ............ | 438/592 |
| 2012/0074484 | A1 * | 3/2012 | Kang et al. ........... | 438/594 |
| 2012/0126302 | A1 * | 5/2012 | Noda et al. ........... | 438/587 |
| 2012/0280300 | A1 * | 11/2012 | Kim et al. ............ | 438/586 |
| 2012/0280325 | A1 * | 11/2012 | Kim et al. ............ | 438/197 |
| 2013/0084696 | A1 * | 4/2013 | Kim et al. ............ | 438/588 |
| 2013/0161716 | A1 * | 6/2013 | Kim et al. ............ | 438/587 |
| 2013/0256761 | A1 * | 10/2013 | Sim ................... | 257/208 |
| 2014/0061755 | A1 * | 3/2014 | Oh .................... | 438/594 |
| 2014/0061761 | A1 * | 3/2014 | Kubota ................ | 438/422 |
| 2014/0077304 | A1 * | 3/2014 | Huang et al. .......... | 438/585 |

FOREIGN PATENT DOCUMENTS

| EP | 1804293 A1 * | 7/2007 | ......... H01L 21/8247 |
|---|---|---|---|
| JP | 2008306045 A * | 12/2008 | |
| KR | 102120124349 A | 11/2012 | |

* cited by examiner

*Primary Examiner* — Zandra Smith
*Assistant Examiner* — Toniae Thomas
(74) *Attorney, Agent, or Firm* — William Park & Associates Patent Ltd.

(57) ABSTRACT

A method of manufacturing a semiconductor device includes forming first and second gate lines over a semiconductor substrate, wherein each second gate line has a greater width than each of the first gate lines, forming a first insulating layer surrounding the top and side walls of the first and the second gate lines so that first air gaps are formed between the first and second gate lines and between the first gate lines, forming a first reaction region in the first insulating layer by diffusing an etchant to a depth less than a target depth from a surface of the first insulating layer, removing the first reaction region, forming second reaction regions in the first insulating layer by diffusing the etchant to the target depth from the surface of the first insulating layer, and removing the second reaction regions exposing a portion of each first and second gate lines.

10 Claims, 10 Drawing Sheets

METHOD OF MANUFACTURING SEMICONDUCTOR DEVICE

CROSS-REFERENCE TO RELATED APPLICATION

Priority to Korean patent application number 10-2011-0140200 filed on Dec. 22, 2011, the entire disclosure of which is incorporated by reference herein, is claimed.

BACKGROUND

Embodiments of the present invention relate generally to various methods of manufacturing a semiconductor device and, more particularly, to various methods of manufacturing a semiconductor device including gate lines.

A semiconductor device includes numerous transistors, which may be arranged densely and regularly. For example, flash memory includes multiple strings regularly arranged, each including a plurality of cell transistors coupled in series between select transistors. A gate line coupled to the gates of the cell and select transistors may be defined as word and select lines, respectively. In general, the distance between adjacent select lines is greater than the distance between adjacent word lines.

As the complexity of integration increases, since the distance between gate lines shrinks, an interference phenomenon between cell transistors increases. In order to reduce the interference phenomenon between cell transistors, a method of forming an air gap between the cell transistors has been proposed. However, this process as is leads to many problems, and thus requires process improvements.

BRIEF SUMMARY

An embodiment of the present invention relates to a method of manufacturing a semiconductor device including an air gap between gate lines.

The method of manufacturing a semiconductor device includes forming first gate lines and second gate lines over a semiconductor substrate, wherein each of the second gate lines has a greater width than each of the first gate lines, forming a first insulating layer surrounding top and side walls of the first and the second gate lines so that first air gaps are formed between the first and second gate lines adjacent to each other and between the first gate lines, forming a first reaction region in the first insulating layer by diffusing an etchant to a depth less than a target depth from a surface of the first insulating layer, removing the first reaction region, forming second reaction regions in the first insulating layer by diffusing the etchant to the target depth from the surface of the first insulating layer, and removing the second reaction regions so that a portion of each of the first and the second gate lines is exposed.

DESCRIPTION OF EMBODIMENTS

Hereinafter, various embodiments of the present disclosure will be described in detail with reference to the accompanying drawings. The figures are provided to allow those having ordinary skill in the art to understand the scope of the embodiments of the disclosure.

FIGS. 1A to 1D are cross-sectional views illustrating a method of manufacturing a semiconductor device according to an embodiment of the present invention.

Figure 1A:
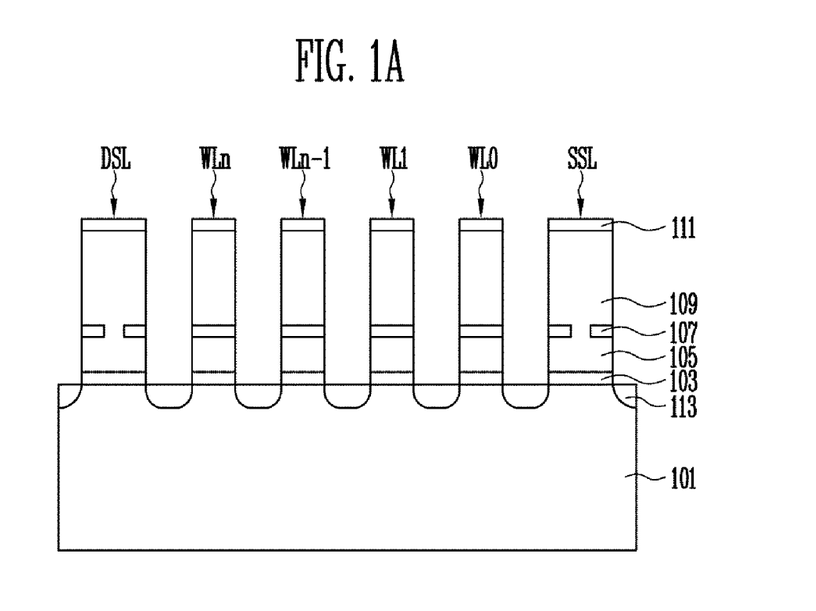
FIGS. 1A to 1D are cross-sectional views illustrating a method of manufacturing a semiconductor device according to an embodiment of the present invention.

Referring to FIG. 1A, gate lines SSL, WL0 to WLn, and DSL having second silicon layers 109 as the highest layers are formed over a semiconductor substrate 101.

For example, in NAND flash memory, first gate lines including the word lines WL0 to WLn and second gate lines including the drain select lines DSL and the source select lines SSL are formed. The first and the second gate lines may be formed in cell regions, and although not shown, the gate lines of a high-voltage transistor and a low-voltage transistor may be formed in peripheral circuit regions, and the drain and source select lines DSL and SSL are adjacently disposed.

The following processes may be performed in order to form the first and the second gate lines.

A well (not shown) is formed in the semiconductor substrate 101. Structures, which include a tunnel insulating layer 103, a first silicon layer 105, a dielectric layer 107, and the second silicon layer 109 sequentially stacked, to form gates are stacked over the semiconductor substrate 101. In order to form the stack structures, the tunnel insulating layer 103 is formed on the entire surface of the semiconductor substrate 101, which acts as a gate insulating layer for the high-voltage transistor or the low-voltage transistor formed in a peripheral circuit region. The first silicon layer 105 is formed on the tunnel insulating layer 103, and may have a single layer of an undoped polysilicon layer or a doped polysilicon layer or may have a stack structure of an undoped polysilicon layer and a doped polysilicon layer. A 3-valence impurity or a 5-valence impurity may be added to the doped polysilicon layer.

The first silicon layer 105 is etched by an etch process using an isolation mask as an etch barrier to define isolation regions. Thus, the first silicon layer 105 is patterned as a plurality of parallel silicon lines. Trenches (not shown) are formed in the respective isolation regions in parallel crossing the substrate by etching the tunnel insulating layer 103 and the semiconductor substrate 101. An insulating layer is formed so that the trenches may be filled. The insulating layer on the top surface of the isolation mask is removed so that the insulating layer remains within and over the trenches. As a result, isolation layers (not shown) are formed.

After removing the isolation mask, the dielectric layer 107 is formed over the entire structure. The dielectric layer 107 has a stack structure, including an oxide layer/nitride layer/oxide layer. The oxide layer or the nitride layer may be replaced with an insulating layer which has a higher dielectric constant than the oxide layer or the nitride layer. A portion of the dielectric layer 107 is etched in regions where the select lines DSL and SSL will be formed. Accordingly, a portion of the first silicon layer 105 is exposed in the regions where the drain and source select lines DSL and SSL will be formed.

The second silicon layer 109 is formed over the dielectric layer 107. The second silicon layer 109 may be formed of a doped polysilicon layer.

A hard mask layer 111 is formed over the second silicon layer 109. The hard mask layer 111, the second silicon layer 109, and the dielectric layer 107 are patterned in a direction to cross the silicon lines that have been formed by patterning the first silicon layer 105, forming a plurality of parallel control gates. Once the first silicon layer 105 is etched and the hard mask layer 111 is removed in a subsequent process, a plurality of gate lines SSL, WL0 to WLn, and DSL is formed over the semiconductor substrate 101, with the second silicon layers 109 becoming the highest layers of the stack structures.

Since the second silicon layers 109 are formed on which a portion of the dielectric layer 107 has been etched, the first silicon layers 105 and the second silicon layers 109 of the drain and source select lines DSL and SSL are coupled through the etched portion of the dielectric layer 107.

The widths of each of the drain and source select lines DSL and SSL are larger than those of each of the word lines WL0 to WLn. Although not shown, the distance between adjacent drain select lines DSL and the distance between adjacent source select lines SSL are greater than the distance between the word lines WL0 to WLn.

Junctions 113 are formed in the semiconductor substrate 101 between the gate lines SSL, WL0 to WLn, and DSL by an ion implantation process, and may be formed by implanting a 5-valence impurity.

Figure 1B:
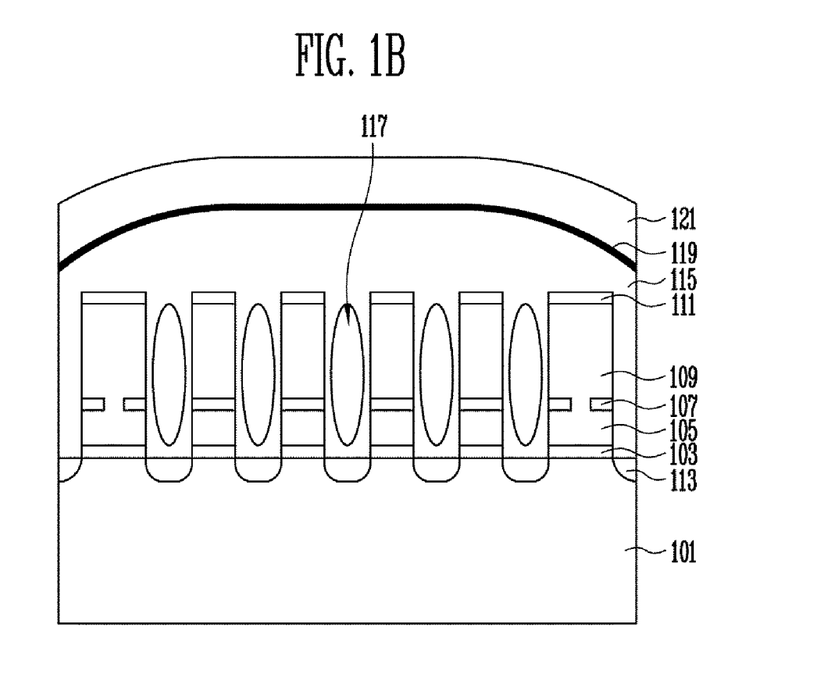

Referring to FIG. 1B, a first insulating layer 115, which may be used as a spacer, is formed over the entire structure including the gate lines SSL, WL0 to WLn, and DSL. Although not shown, a portion of each of the junctions 113 between the drain select lines DSL and between the source select lines SSL is exposed through the first insulating layer 115.

Specifically, the first insulating layer 115 is formed to surround the sidewalls and tops of the gate lines SSL, WL0 to WLn, and DSL. Although not shown, either the source select lines SSL are symmetrically arranged with the junctions 113 interposed between, or the drain select lines DSL are symmetrically arranged with the junctions 113 interposed between. The distance between adjacent source select lines SSL and the distance between adjacent drain select lines DSL are greater than the distance between the source select line SSL and the word line WL0, the distance between the drain select line DSL and the word line WLn, and the distance between the adjacent word lines WL0 to WLn.

In the process of forming the first insulating layer 115, overhangs are formed at the top corners of the gate lines DSL, SSL, and WL0 to WLn, where. the space between the source select line SSL and the word line WL0, the space between the drain select line DSL and the word line WLn, and the spaces between the adjacent word lines WL0 to WLn are not fully filled with the first insulating layer 115. Each of the spaces has a relatively small width, and because of the overhangs first air gaps 117 are formed in the spaces between the source select line SSL and the word line WL0, between the drain select line DSL and the word line WLn, and between the adjacent word lines WL0 to WLn. The first insulating layer 115 is formed on the sidewalls of the source and drain select lines SSL and DSL and also have opened sidewalls itself. If the first insulating layer 115 is formed as described above, the first insulating layer 115 is formed to cover the gate lines from the drain select line DSL to the source select line SSL, and the first insulating layer 115 has the opened sidewalls on the sidewalls of the drain select line DSL and the source select line SSL.

The first insulating layer 115 becomes a spacer when an etch-back process is performed. Although not shown, the first insulating layer 115 as a spacer exposes the junctions 113 between adjacent drain select lines DSL and between adjacent source select lines SSL. The first insulating layer 115 as a spacer forms the first air gaps 117 between the source select line SSL and the word line WL0, between the drain select line DSL and the word line WLn, and between adjacent word lines WL0 to WLn. The first insulating layer 115 remains so that it covers the gate lines DSL, WL0 to WLn, and SSL and the junctions 113 between the source select line SSL and the word line WL0, between the drain select line DSL and the word line WLn, and between adjacent word lines WL0 to WLn.

The first insulating layer 115 may be formed of a silicon oxide ($SiO_2$) layer.

An etch-stop layer 119 is formed on a surface of the entire structure including the first insulating layer 115. A second insulating layer 121 for an interlayer insulating layer is formed over the etch-stop layer 119.

The etch-stop layer 119 may be formed of a nitride layer, and is formed on the surface of the entire structure with a thickness to the extent that the structure of the gate lines DSL, SSL, and WL0 to WLn remain within the first insulating layer 115. The second insulating layer 121 may be formed of an oxide layer and is formed over the entire structure with a thickness enough to fill the spaces between the drain select lines DSL and the source select lines SSL.

Figure 1C:
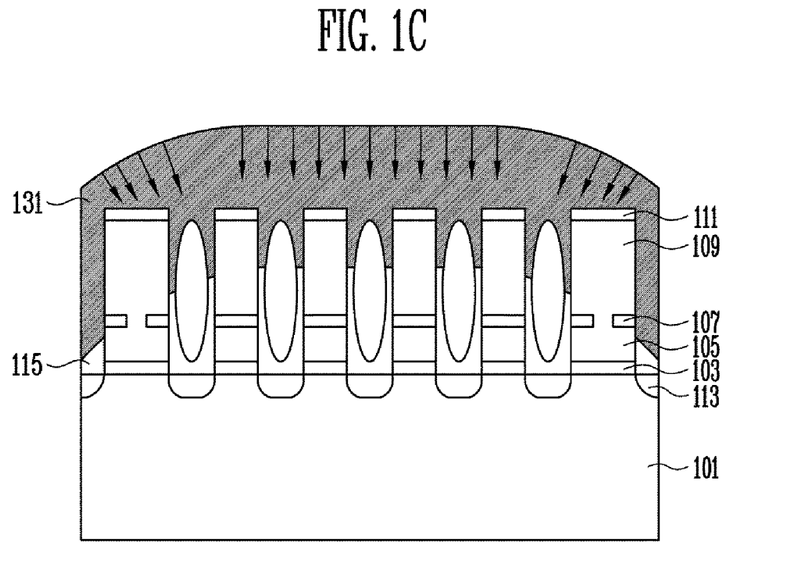

Referring to FIG. 1C, the surface of the second insulating layer 121 is polished by a polishing process until the etch-stop layer 119 is exposed. The first insulating layer 115 over the air gaps 117 is exposed by removing the etch-stop layer 119. As a result, the second insulating layer 121 and the etch-stop layer 119 remain between adjacent source select lines SSL and between adjacent drain select lines DSL.

An etchant is diffused into the first insulating layer 115 thereby forming a reaction region 131 in which reaction products are formed due to reaction of the etchant with the first insulating layer 115. The etchant is diffused from the sidewalls of the first insulating layer 115, thus forming on the sidewalls of the drain and source select lines DSL and SSL, and from the top surface of the first insulating layer 115. A considerable amount of the etchant is diffused into the word lines WL0 and WLn adjacent to the drain and source select line DSL and SSL. The reaction region 131 may cover more area between the drain select line DSL and the word line WLn and between the source select line SSL and the word line WL0 than between the adjacent word lines WL0 to WLn.

Figure 1D:
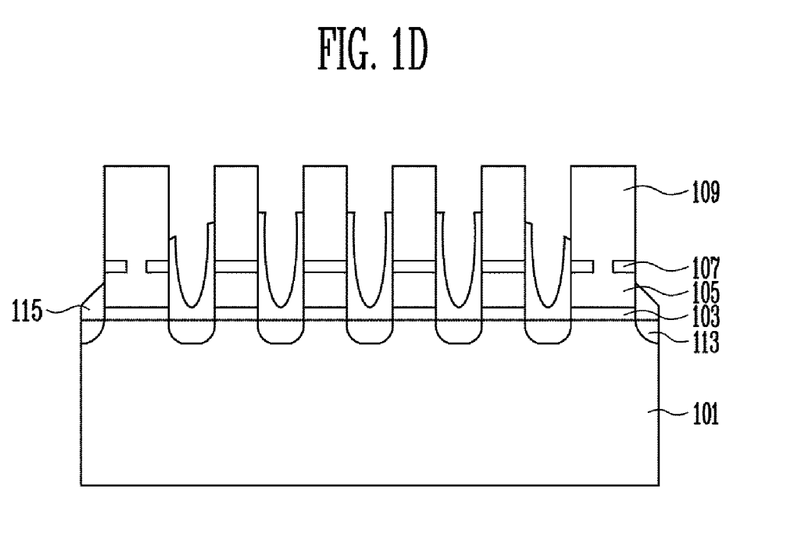

Referring to FIG. 1D, the reaction region 131 and the hard mask layer 111 are removed. Thus, the second silicon layer 109 of the gate lines SSL, WL0 to WLn, and DSL is exposed, which will react with a metal layer through a silicidation process to form metal silicide layers. If the reaction region 131 covers more area close to the drain or source select line DSL or SSL, the exposed areas of the sidewalls of the second silicon layer 109 may be increased close to the drain or source select line DSL or SSL. The resistance of the word line WL0 or WLn may also be affected during the silicidation process.

FIGS. 2A to 2F are cross-sectional views illustrating a method of manufacturing a semiconductor device according to another embodiment of the present invention.

Figure 2A:
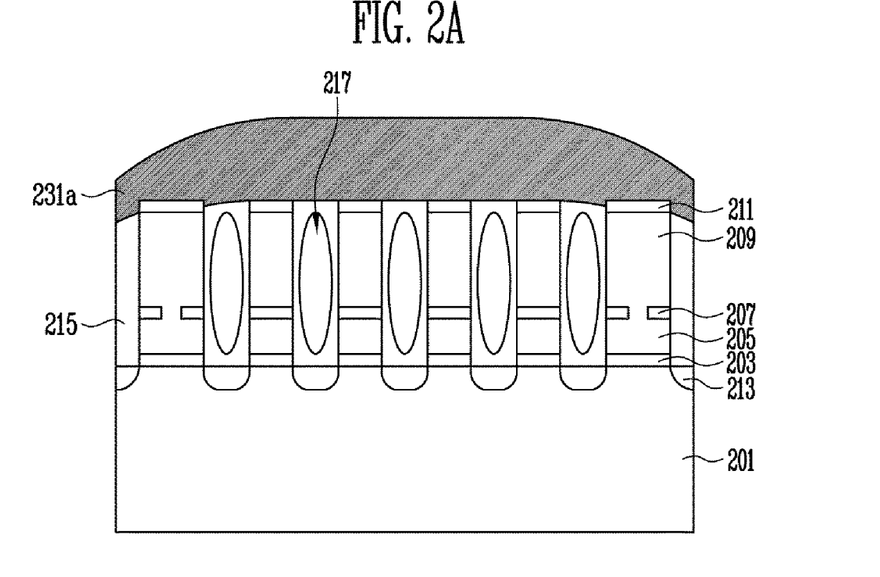
FIGS. 2A to 2F are cross-sectional views illustrating a method of manufacturing a semiconductor device according to another embodiment of the present invention.

Referring to FIG. 2A, gate lines SSL, WL0 to WLn, and DSL are formed over a semiconductor substrate 201, and. may be formed by patterning a tunnel insulating layer 203, a first silicon layer 205, a dielectric layer 207, and a second silicon layer 209, sequentially stacked, using the same process as that described with reference to FIG. 1A. In NAND flash memory for example, first gate lines including the word lines WL0 to WLn and second gate lines including the drain select lines DSL and the source select lines SSL are formed.

In the patterning process of the gate lines SSL, WL0 to WLn, and DSL, hard mask layers 211 are used as etch barriers on the top surfaces of the second silicon layers 209 of the gate lines SSL, WL0 to WLn, and DSL. The hard mask layers 211 are removed in a subsequent process, thereby making the second silicon layers 209 the highest layers of the gate lines SSL, WL0 to WLn, and DSL.

Each of the drain and source select lines DSL and SSL are formed to have a greater width than each of the word lines WL0 to WLn. Although not shown, multiple drain select lines DSL are adjacently disposed, and multiple source select lines SSL are adjacently disposed. The distance between adjacent drain select lines DSL and the distance between adjacent source select lines SSL are greater than the distance between adjacent word lines WL0 to WLn.

Junctions 213 are formed in the semiconductor substrate 201 between the gate lines SSL, WL0 to WLn, and DSL by an ion implantation process, and may be formed by implanting a 5-valence impurity.

As described above with reference to FIG. 1B, a first insulating layer 215, which may be used as a spacer, is formed over the entire structure (not shown) including the gate lines SSL, WL0 to WLn, and DSL. Although not shown, a portion of each of the junctions 213 between adjacent drain select lines DSL and between adjacent source select lines SSL is exposed through the first insulating layer 215. The first insulating layer 215 has sidewalls formed on the sides of the source and drain select lines SSL and DSL. In the process of forming the first insulating layer 215, overhangs are formed at the top corners of the gate lines DSL, SSL, and WL0~WLn. For this reason, the first insulating layer 215 is not fully filled, and first air gaps 217 are formed between the source select line SSL and the word line WL0, between the drain select line DSL and the word line WLn, and between the adjacent word lines WL0 to WLn. Furthermore, the sidewalls of the first insulating layer 215 formed on the sides of the source and drain select lines SSL and DSL are exposed. The first insulating layer 215 may be formed of a silicon oxide ($SiO_2$) layer.

An etch-stop layer and a second insulating layer for interlayer insulating layers may be further formed over the first insulating layer 215, as described above with reference to FIG. 1B. As described above with reference to FIG. 1C, a process of polishing the second insulating layer and a process of removing the etch-stop layer so that the first insulating layer 215 over the gate lines DSL, SSL, and WL0 to WLn is exposed may be further performed.

A first reaction region 231a in which an etchant reacts with the first insulating layer 215 is formed within the first insulating layer 215 by diffusing the etchant into the first insulating layer 215 in a depth less than a target depth. The reaction of the etchant and the first insulating layer 215 ends at the top surfaces of the source and drain select lines SSL and DSL or at the top surface of the hard mask layer 211 so that the first reaction region 231a comes in contact with the top surfaces of the source and drain select lines SSL and DSL or the top surface of the hard mask layer 211. The time duration of the reaction process may be set by controlling the reaction time.

The etchant may be $NH_4F$ or $NH_4F.HF$ radical generated by reacting source gases including $NF_3$ and $NH_3$ with plasma.

The $NH_4F$ etchant or the $NH_4F.HF$ radical etchant reacts with the first insulating layer 215, that is, the silicon oxide layer in a first temperature, thus generating $(NH_4)_2SiF_6$ of a solid state in the first reaction region 231a. The first temperature may be 30° C.

When the first reaction region 231a is formed in a limited manner at the top surfaces of the drain and source select lines DSL and SSL or at the top surface of the hard mask layer 211, the first insulating layer 215 between the word lines WL0 to WLn, between the drain select line DSL and the word line WLn, and between the source select line SSL and the word line WL0 remain by rarely reacting with the etchant, so that the first air gaps 217 may remain intact.

Figure 2B:
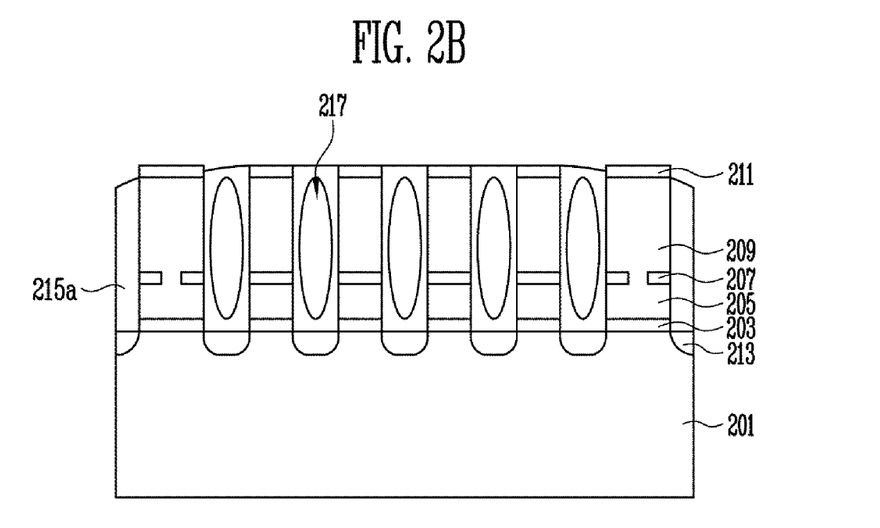

Referring to FIG. 2B, the first reaction region 231a is removed by applying heat so that the temperature within a reaction chamber becomes a second temperature that is higher than the first temperature. The first reaction region 231a including $(NH_4)_2SiF_6$ of a solid state is sublimated into $SiF_4$, $NH_3$, and HF of a gaseous state in the second temperature and thus removed. The second temperature may be 100° C. or higher.

As the first reaction region 231a is removed, first insulating layers 215a remain between adjacent word lines WL0 to WLn, between the drain select line DSL and the word line WLn, and between the source select line SSL and the word line WL0. Each of the first insulating layers 215a has a more uniform height compared to that of the first insulating layer 115 in the earlier embodiment.

Figure 2C:
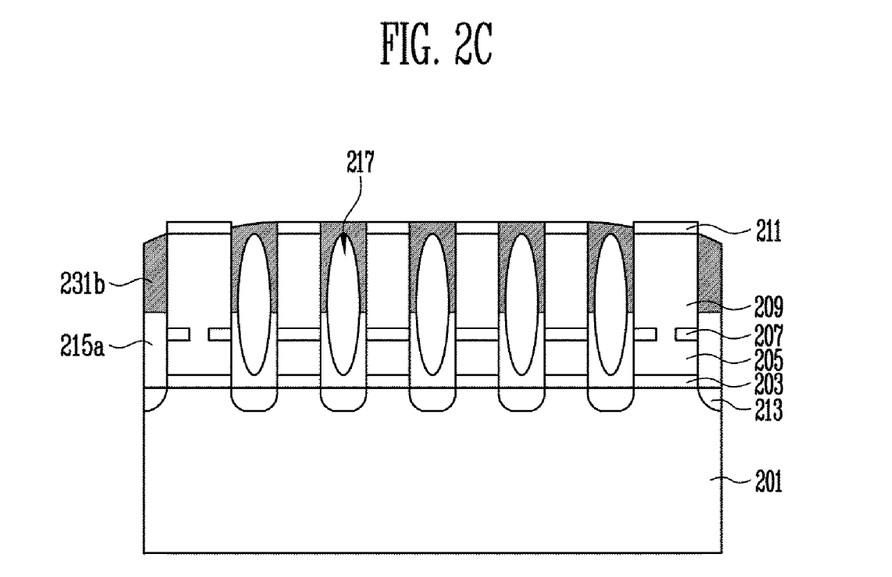

Referring to FIG. 2C, second reaction regions 231b are formed by diffusing an etchant, generated using the same process as that described with reference to FIG. 2A, into the remaining first insulating layers 215a. The etchant may be uniformly diffused at a target depth because the etchant is downwardly diffused from a surface of the first insulating layers 215a that rarely have steps and are at uniform height. The depth that each of the second reaction regions 231b is formed at the target depth of the gate lines DSL, SSL, and WL0 to WLn may be controlled by controlling the diffusion depth of the etchant. The second reaction region 231b may also be formed at the tops and on the side walls of the first air gaps 217.

As described above with reference to FIG. 2A, $(NH_4)_2SiF_6$ reaction products of a solid state may be formed in the second reaction regions 231b.

Figure 2D:
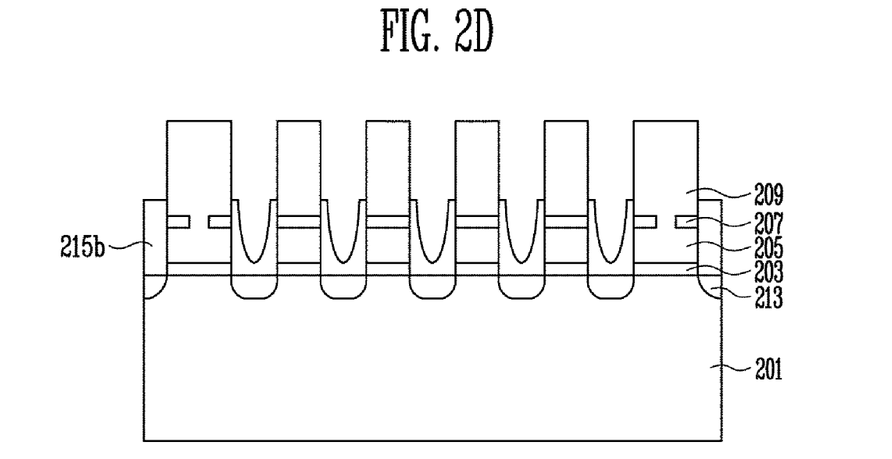

Referring to FIG. 2D, the second reaction regions 231b and the hard mask layers 211 are removed. The first insulating layers 215b that are of a uniform height and which do not react with the etchant may remain between the adjacent word lines WL0 to WLn, between the drain select line DSL and the word line WLn, and between the source select line SSL and the word line WL0. Furthermore, the first air gaps 217 are uniformly exposed as compared with the earlier embodiment, and the sidewalls of the second silicon layers 209 are exposed to a target area.

Figure 2E:
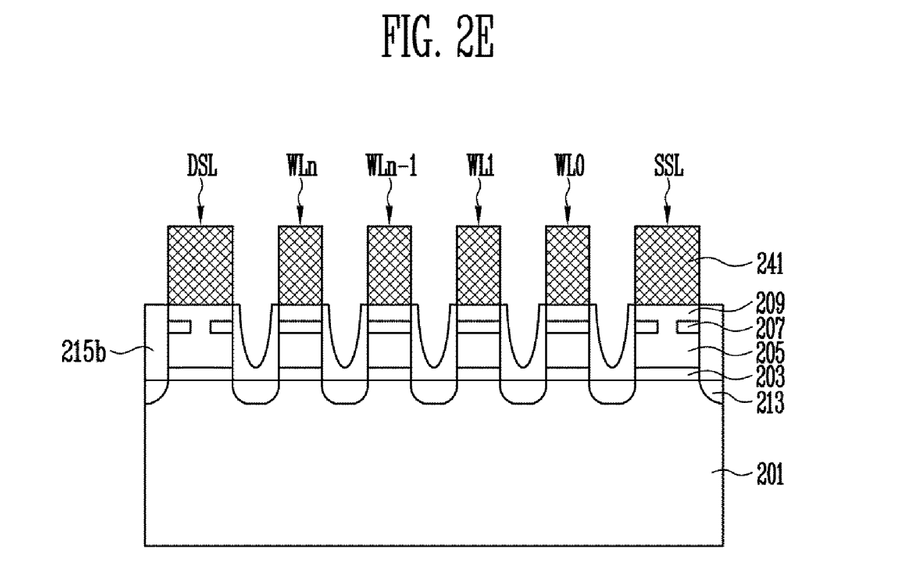

Referring to FIG. 2E, the exposed parts of the second silicon layers 209 are formed into silicide layers 241 by a silicidation process. The silicidation process is described in detail below.

The exposed parts of the second silicon layers 209 are covered with a metal layer, made of cobalt, tungsten, or nickel for example. When thermal treatment is performed, the metal silicide layers 241 are formed by reacting the metal layer with the second silicon layer 209. If the metal layer is made of tungsten, tungsten silicide layers are formed, if the metal layer is made of cobalt, cobalt silicide layers are formed, and if the metal layer is made of nickel, nickel silicide layers are formed. The metal layer that remains without reacting with the second silicon layer 209 is removed.

In accordance with an embodiment of the present invention, the silicide layers 241 are formed in the state in which the first insulating layers 215b having a uniform height remain and the second silicon layers 209 are uniformly exposed. The resistance of the gate lines SSL, WL0 to WLn, and DSL may be made uniformly because the silicide layers 241 are of uniform height.

Figure 2F:
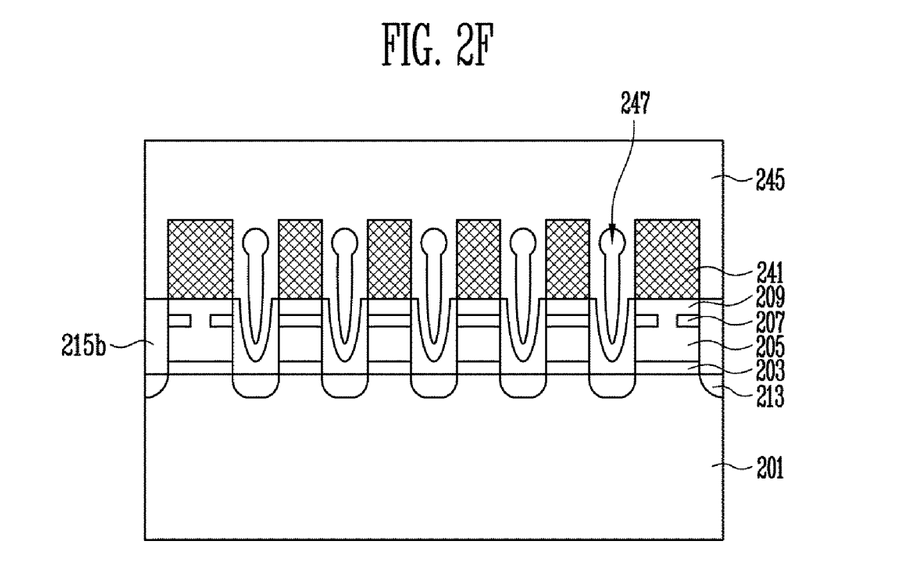

Referring to FIG. 2F, a third insulating layer 245 for interlayer insulating layers is formed over the entire structure including the silicide layers 241, thereby forming second air gaps 247 since the openings of the first air gaps 217 are blocked by the overhangs of the third insulating layer 245.

In accordance with an embodiment of the present invention, the second air gaps 247 may be uniformly formed within the first air gaps 217 because the third insulating layer 245 is formed on the first air gaps 217 that are uniformly exposed.

Although the width of each of the gate lines SSL, WL0 to WLn, and DSL is reduced by the aforementioned processes, resistance of the gate lines SSL, WL0 to WLn, and DSL may be reduced because the silicide layers 241 have low resistance. Furthermore, interference between memory cells may be improved because the second air gap 247 is formed between the source select line SSL and the word line WL0, between the drain select line DSL and the word line WLn, between adjacent word lines WL0 to WLn, and between the first silicon layers 205 which are used as the floating gates of flash memory.

FIGS. 3A to 3H are cross-sectional views illustrating a method of manufacturing a semiconductor device according to another embodiment of the present invention. Central and edge regions of a wafer are illustrated in FIGS. 3A to 3H, for simplicity. The wafer is a semiconductor substrate 301.

Figure 3A:
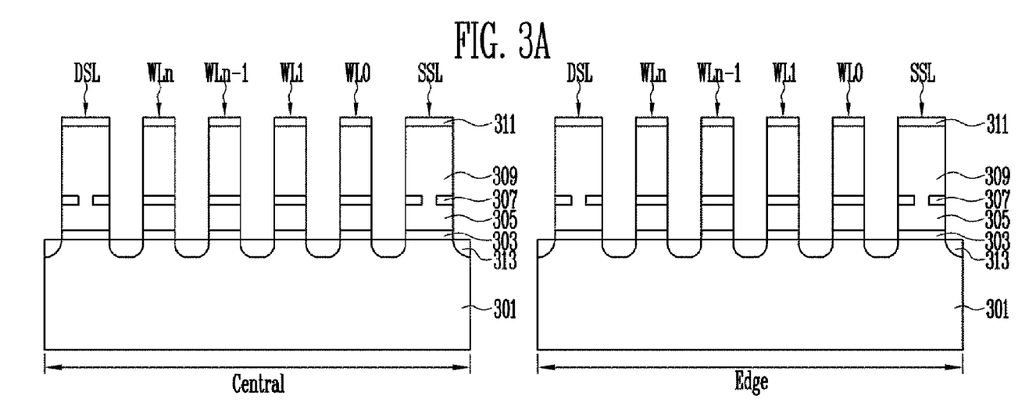
FIGS. 3A to 3H are cross-sectional views illustrating a method of manufacturing a semiconductor device according to another embodiment of the present invention.

Referring to FIG. 3A, gate lines SSL, WL0 to WLn, and DSL are formed over a semiconductor substrate 301 and. may be formed by patterning a tunnel insulating layer 303, a first silicon layer 305, a dielectric layer 307, and a second silicon layer 309, sequentially stacked, using the same process as that described with reference to FIG. 1A. For NAND flash memory as an example, first gate lines including the word lines WL0 to WLn and second gate lines including the drain select lines DSL and the source select lines SSL are formed.

In the patterning process of the gate lines SSL, WL0 to WLn, and DSL, hard mask layers 311 used as etch barriers may remain above the second silicon layers 309 of the gate lines SSL, WL0 to WLn, and DSL, and are later removed in a subsequent process. Accordingly, the second silicon layers 309 become the highest layers of the gate lines SSL, WL0 to WLn, and DSL.

Each of the drain and source select lines DSL and SSL are formed to have a greater width than each of the word lines WL0 to WLn. Although not shown, the drain select lines DSL are adjacently disposed, and the source select lines SSL are adjacently disposed. The distance between adjacent drain select lines DSL and the distance between adjacent source select lines SSL are greater than the distance between the adjacent word lines WL0 to WLn.

Junctions 313 are formed in the semiconductor substrate 301 between the gate lines SSL, WL0 to WLn, and DSL by an ion implantation process, and may be formed by implanting a 5-valence impurity.

Figure 3B:
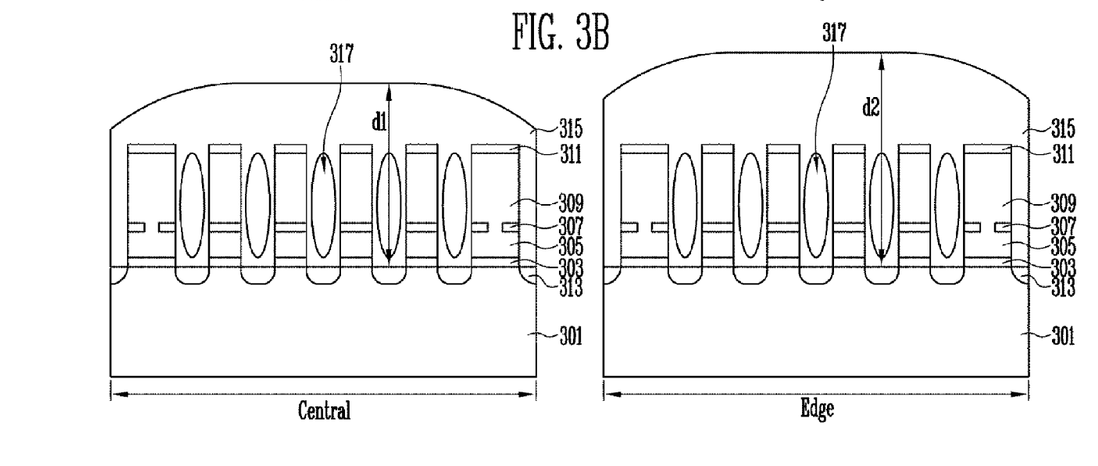

Referring to FIG. 3B, as described above with reference to FIG. 1B, a first insulating layer 315, which may be used as a spacer, is formed over the entire structure including the gate lines SSL, WL0 to WLn, and DSL. Although not shown, a portion of each of the junctions 313 between the drain select lines DSL and the source select lines SSL is not covered by the first insulating layer 315. The first insulating layer 315 has sidewalls formed on the sides of the source and drain select lines SSL and DSL.

In the process of forming the first insulating layer 315, overhangs are formed at the top corners of the gate lines DSL, SSL, and WL0 to WLn. For this reason, the first insulating layer 315 is not fully filled between the source select line SSL and the word line WL0, between the drain select line DSL and the word line WLn, and between the adjacent word lines WL0 to WLn, thereby forming first air gaps 317. Sidewalls of the first insulating layer 315 formed on the sides of the second gate lines SSL and DSL are exposed. The first insulating layer 315 may be formed of a silicon oxide ($SiO_2$) layer. The thickness d2 of the first insulating layer 315 in the edge region may be greater than the thickness d1 of the first insulating layer 315 in the central region.

An etch-stop layer and a second insulating layer for interlayer insulating layers may be further formed over the first insulating layer 315, as described above with reference to FIG. 1B. As described above with reference to FIG. 1C, a process of polishing the second insulating layer and a process of removing the etch-stop layer so that the first insulating layer 315 is exposed may be further performed.

Figure 3C:
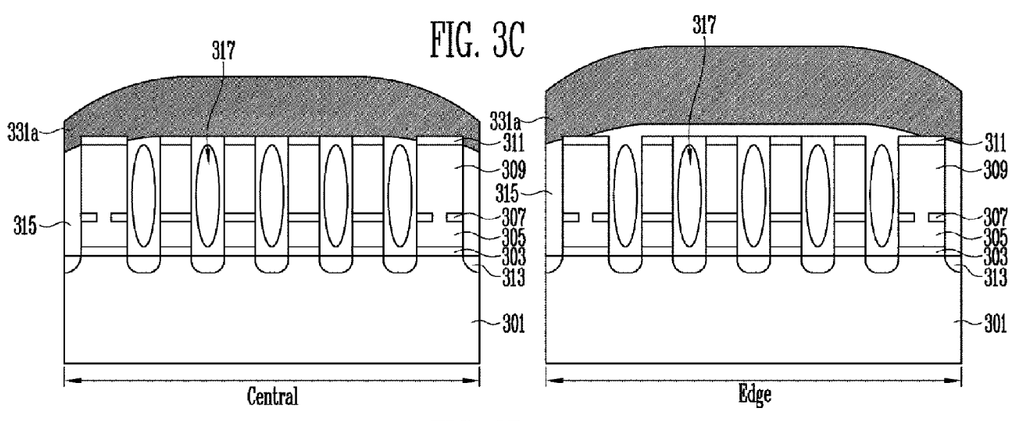

Referring to FIG. 3C, a first reaction region 331a is formed by diffusing the etchant into the first insulating layer 315. The etchant is controlled so that the etchant is not diffused to a target depth, but rather to some depth of the first insulating layer 315 which is spaced apart from the first air gaps 317. As a result, the first insulating layer 315 that has not reacted with the etchant remains between the first reaction region 331a and the first air gap 317. In embodiments of the present invention, the degree that the etchant is diffused may be controlled so that the first reaction region 331a is formed to a specific depth of the top surfaces of the drain and source select lines DSL and SSL in the central region.

The etchant may be $NH_4F$ or $NH_4F.HF$ radicals generated by reacting source gases, including $NF_3$ and $NH_3$, with plasma, as described above with reference to FIG. 2A. $(NH_4)_2SiF_6$ of a solid state is formed in the first reaction region 331a.

Diffusion of the etchant is controlled so that the first reaction region 331a does not reach the tops of the first air gaps 317. The first insulating layer 315 between adjacent word lines WL0 to WLn, between the drain select line DSL and the word line WLn, and between the source select line SSL and the word line WL0 remains so that the first air gaps 317 may remain intact.

Figure 3D:
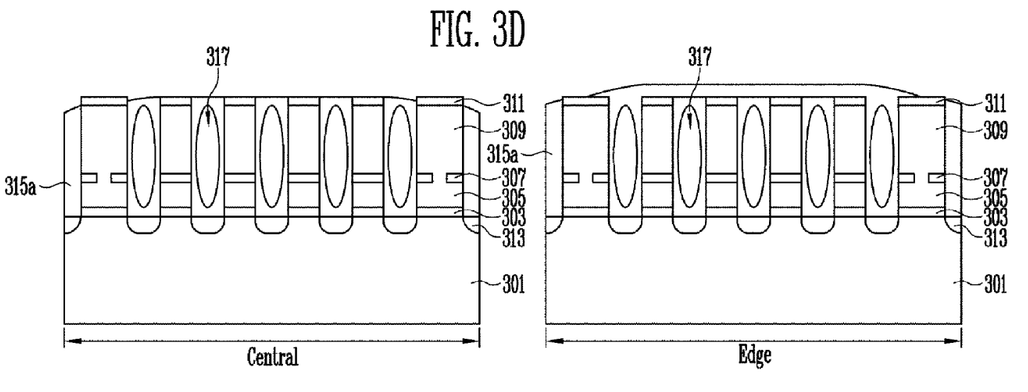

Referring to FIG. 3D, the first reaction region 331a may be sublimated and removed at a second temperature, as described above with reference to FIG. 2B.

When the first reaction region 331a is removed, the first insulating layers 315a that does not react with the etchant in the process of forming the first reaction region 331a, remains. The first insulating layer 315 has a greater thickness in the edge region than in the central region and accordingly, the volume of the first insulating layer 315a is greater in the edge region than in the central region.

Figure 3E:
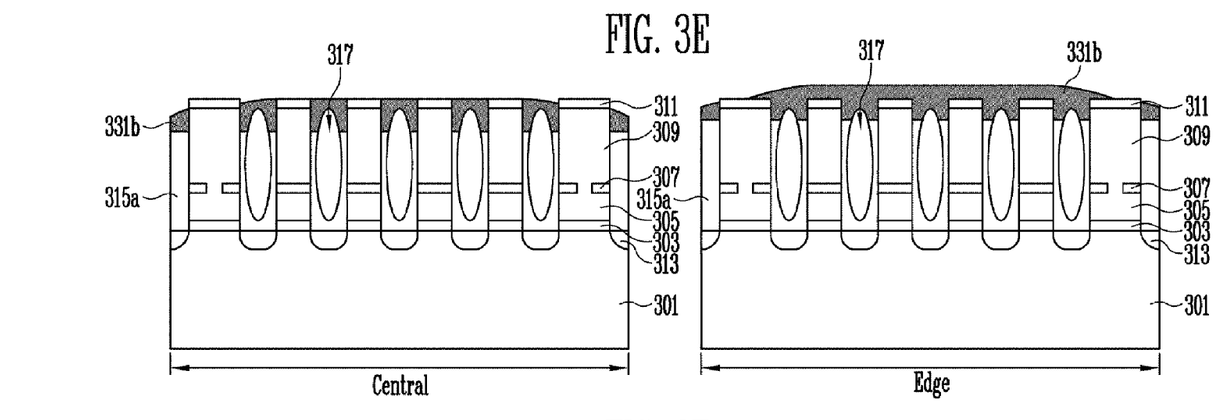

Referring to FIG. 3E, second reaction regions 331b are formed by reacting and diffusing the remaining etchant in FIG. 2A into the first insulating layer 315a. The diffusion rate of the etchant within a specific region of the first insulating layer 315a adjacent to a top of the first air gap 317 is faster than the diffusion rate of the etchant within the first insulating layer 315a over the specific region. Since the thickness of the first insulating layer 315a formed over the first air gap 317 is greater in the edge region than in the central region, a top surface of the first insulating layer 315a in the central region is closer to the specific region of the first insulating layer 315a than in the edge region. Accordingly, at the early stage that the etchant is diffused within the remaining first insulating layer 315a, the etchant is diffused faster in the central region than in the edge region.

Figure 3F:
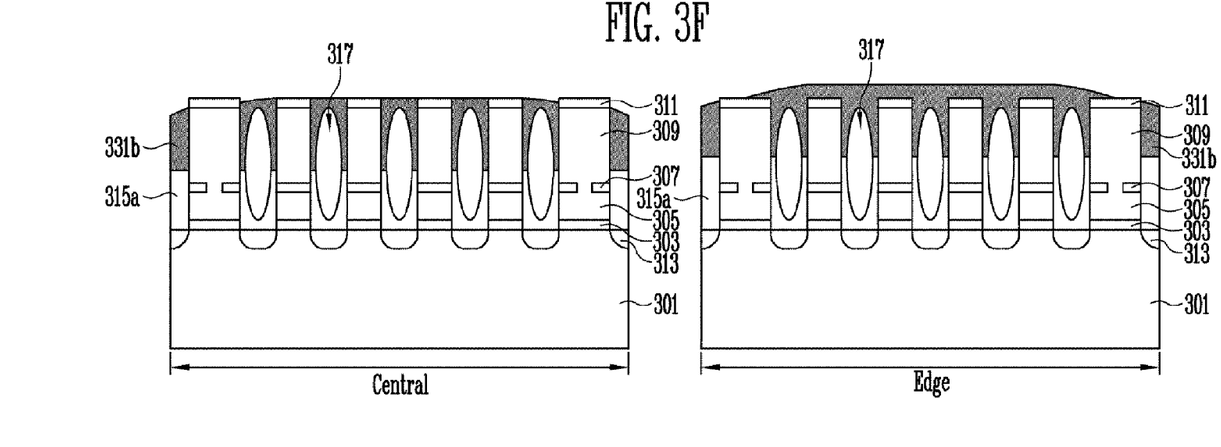

Referring to FIG. 3F, after the process of reacting the etchant with the first insulating layer 315a continues for a predetermined time, the etchant is rarely diffused into the first insulating layers 315a at a specific depth. For example, if the etchant is rarely diffused when it reaches a depth of 300 Å from a surface of the gate lines SSL, WL0 to WLn, and DSL, the etchant in the central region is no longer diffused when it reaches the depth of 300 Å from the surface of the gate lines SSL, WL0 to WLn, and DSL, even though the etchant is diffused in the edge region. Accordingly, the difference between the thickness of the first insulating layers 315a not reacted with the etchant in the central region and the thickness of the first insulating layers 315a not reacted with the etchant in the edge region may be reduced.

As described above with reference to FIGS. 3C and 3D, after forming the first reaction region 331a up to a depth less than the target depth, the process of removing the first reaction region 331a may be omitted and the etchant used to form the first reaction region 331a may be continuously used. In this case, the depth that the etchant is penetrated into the central region may be much greater than the depth that the etchant is penetrated into the edge region because the difference between the diffusion speed of the etchant in the central region and the diffusion speed of the etchant in the edge region is considerable.

In accordance with an embodiment of the present invention, the difference between the depth that the etchant is penetrated into the central region and the depth that the etchant is penetrated into the edge region may be reduced since the etchant is diffused into the state in which the thickness of the first insulating layers 315a remaining over the first air gaps 317 has been reduced.

Figure 3G:
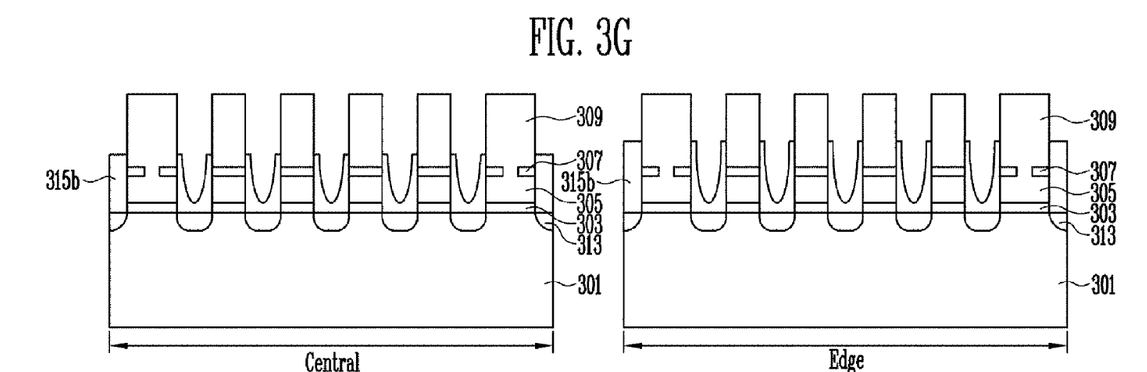

Referring to FIG. 3G, after the second reaction regions 331b are formed at a target depth, the second reaction regions 331b and the hard mask layers 311 are removed. The first insulating layers 315b not reacted with the etchant remain in the edge region and the central region. Furthermore, the first air gaps 317 and sidewalls of the second silicon layers 309 are exposed.

Figure 3H:
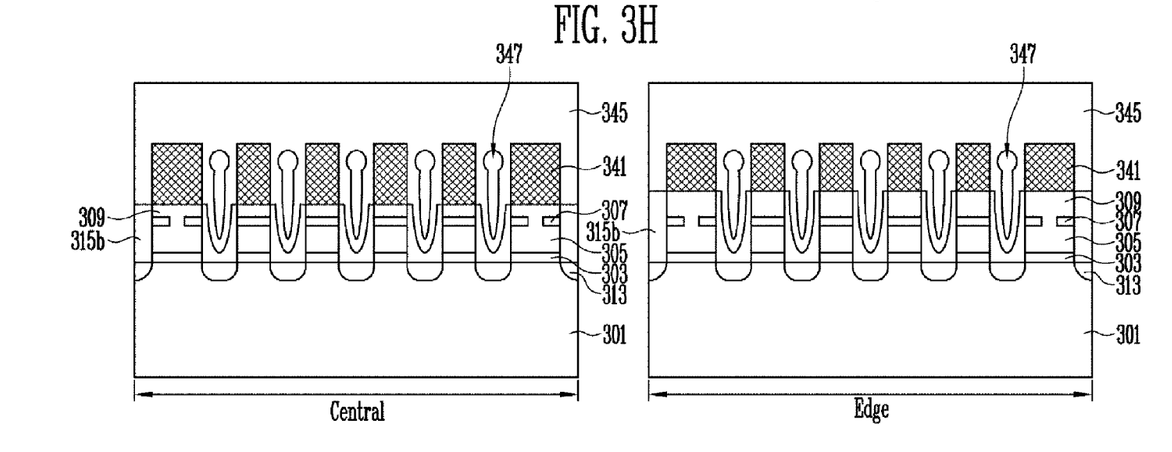

Referring to FIG. 3H, the exposed parts of the second silicon layers 309 are formed into silicide layers 341 by a silicidation process as described with reference to FIG. 2E.

In accordance with the present embodiment, the silicide layers 341 are formed in the state in which the difference between the thickness of the first insulating layer 315b remaining in the central region and the thickness of the first insulating layer 315b remaining in the edge region has been reduced. Consequently, the gate lines SSL, WL0 to WLn, and DSL may have uniform resistance since the aforementioned difference is reduced.

A third insulating layer 345 as an interlayer insulating layer is formed over the entire structure including the silicide layers 341. When forming the third insulating layer 345, the openings of the first air gaps 317 may be blocked by the overhangs of the third insulating layer 345, thus forming second air gaps 347.

Figure 4:
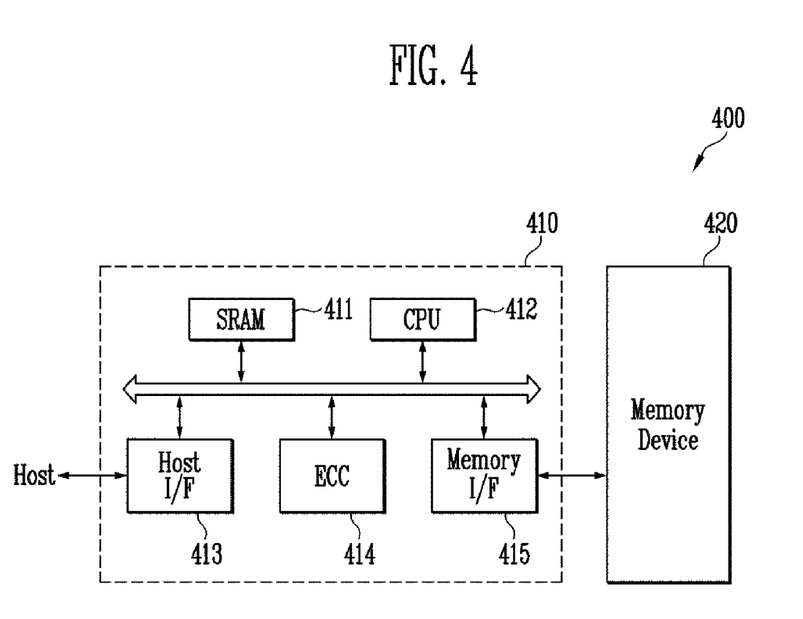
FIG. 4 is a schematic block diagram of a memory system according to an embodiment of the present invention.

FIG. 4 is a schematic block diagram of a memory system according to an embodiment of the present invention.

Referring to FIG. 4, the memory system 400 according to an embodiment of the present invention includes a memory device 420 and a memory controller 410.

The memory device 420 includes at least one of the semiconductor devices formed by the manufacture methods described with reference to FIGS. 2A to 2F and FIGS. 3A to 3H.

The memory controller 410 controls the exchange of data between a host Host and the memory device 420. The memory controller 410 may include a central processing unit (CPU) 412 to control the overall operation of the memory system 400. The memory controller 410 may include SRAM 411 used as the operating memory of the CPU 412, and may further include a host interface (I/F) 413 and a memory I/F 415. The host I/F 413 may be equipped with a data exchange protocol between the memory system 400 and the host. The memory I/F 415 may couple the memory controller 410 and the memory device 420. The memory controller 410 may further include an error correction code (ECC) block 414, which can detect errors in a data read from the memory device 420 and correct the detected errors. Although not shown, the memory system 400 may further include a ROM device to store code data to interface with the host, and may be used as a portable data storage card. In the embodiments, the memory system 400 may use a solid state disk (SSD) that may replace the hard disk of a computer system.

In accordance with the present disclosure, the air gaps are formed between the gate lines, and the etchant is diffused in the deposited insulating layer, but the etchant is not diffused to a target depth at one time. The first reaction region is formed by diffusing the etchant to a depth less than the target depth, the first reaction region is removed, the second reaction regions are formed by diffusing the etchant to the target depth, and the second reaction regions are then removed. Accordingly, the side walls of the gate lines can be exposed with uniform area, and the air gaps can be uniformly exposed between the gate lines since the height of insulating layers remaining between the gate lines may be uniform.

What is claimed is:

1. A method of manufacturing a semiconductor device, comprising:
    forming first gate lines and second gate lines over a semiconductor substrate, wherein each of the second gate lines has a greater width than each of the first gate lines;
    forming a first insulating layer surrounding top and side walls of the first and the second gate lines so that first air gaps are formed between the first and second gate lines adjacent to each other and between the first gate lines;
    forming a first reaction region in the first insulating layer by diffusing an etchant to a depth less than a target depth from a surface of the first insulating layer;
    removing the first reaction region;
    forming second reaction regions in the first insulating layer by diffusing the etchant to the target depth from the surface of the first insulating layer; and
    removing the second reaction regions so that a portion of each of the first and the second gate lines is exposed.

2. The method of claim 1, further comprising:
    siliciding the exposed regions of the first and the second gate lines after removing the second reaction region; and
    forming a second insulating layer over an entire structure comprising the silicided first and second gate lines so that second air gaps are formed between the first and second gate lines adjacent to each other and between the first gate lines.

3. The method of claim 1, wherein the first insulating layer is a silicon oxide layer.

4. The method of claim 1, wherein the etchant is $NH_4F$ or $NH_4F.HF$ radical.

5. The method of claim 4, wherein the etchant is formed by reacting source gases, including $NF_3$ and $NH_3$, with plasma.

6. The method of claim 4, wherein $(NH_4)_2SiF_6$ of a solid state is generated in the first and the second reaction regions by reacting the etchant with the first insulating layer at a first temperature.

7. The method of claim 6, wherein removing the first and the second reaction regions comprises sublimating $(NH_4)_2SiF_6$ of a solid state into $SiF_4$, $NH_3$, and $HF$ of a gaseous state at a second temperature.

8. The method of claim 1, wherein a temperature when removing the first and the second reaction regions is higher than a temperature when forming the first and the second reaction regions.

9. The method of claim 1, wherein forming the first reaction region is performed until the first reaction region comes in contact with a top of the second gate lines.

10. The method of claim 1, wherein the first reaction region is formed so that a region of the first insulating layer not reacting with the etchant remains between the first air gaps and the first reaction region.

* * * * *